(12) United States Patent
Kim et al.

(10) Patent No.: US 11,018,067 B2
(45) Date of Patent: May 25, 2021

(54) SEMICONDUCTOR DEVICE AND METHOD OF MANUFACTURING A SEMICONDUCTOR DEVICE

(71) Applicant: AMKOR TECHNOLOGY SINGAPORE HOLDING PTE. LTD., Valley Point (SG)

(72) Inventors: Kyeong Tae Kim, Incheon (KR); Yi Seul Han, Incheon (KR); Jae Beom Shim, Incheon (KR); Tae Yong Lee, Gyeonggi-do (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 16/419,650

(22) Filed: May 22, 2019

(65) Prior Publication Data

US 2020/0373214 A1 Nov. 26, 2020

(51) Int. Cl.

| H01L 23/31 | (2006.01) |
|---|---|
| H01L 23/00 | (2006.01) |
| H01L 21/56 | (2006.01) |
| H01L 23/528 | (2006.01) |
| H01L 23/522 | (2006.01) |
| H01L 23/48 | (2006.01) |

(52) U.S. Cl.
CPC .......... *H01L 23/3128* (2013.01); *H01L 21/56* (2013.01); *H01L 23/481* (2013.01); *H01L 23/5226* (2013.01); *H01L 23/5283* (2013.01); *H01L 24/09* (2013.01)

(58) Field of Classification Search
CPC ............... H01L 23/3128; H01L 23/481; H01L 23/5226; H01L 23/5283; H01L 24/09
See application file for complete search history.

(56) References Cited

U.S. PATENT DOCUMENTS

| 2010/0244278 A1* | 9/2010 | Shen | H01L 23/49537 |
| | | | 257/778 |
| 2012/0199968 A1* | 8/2012 | Park | H01L 25/50 |
| | | | 257/737 |
| 2013/0147041 A1* | 6/2013 | Chan | H01L 25/105 |
| | | | 257/738 |
| 2014/0035156 A1* | 2/2014 | Hsu | H01L 24/19 |
| | | | 257/774 |

(Continued)

*Primary Examiner* — Nathan W Ha
(74) *Attorney, Agent, or Firm* — McAndrews, Held & Malloy, Ltd.

(57) ABSTRACT

In one example, a semiconductor device can comprise (a) an electronic device comprising a device top side, a device bottom side opposite the device top side, and a device sidewall between the device top side and the device bottom side, (b) a first conductor comprising, a first conductor side section on the device sidewall, a first conductor top section on the device top side and coupled to the first conductor side section, and a first conductor bottom section coupled to the first conductor side section, and (c) a protective material covering the first conductor and the electronic device. A lower surface of the first conductor top section can be higher than the device top side, and an upper surface of the first conductor bottom section can be lower than the device top side. Other examples and related methods are also disclosed herein.

21 Claims, 7 Drawing Sheets

(56) References Cited

U.S. PATENT DOCUMENTS

| | | | | |
|---|---|---|---|---|
| 2014/0217575 A1* | 8/2014 | Hung | ...................... | H01L 23/36 |
| | | | | 257/713 |
| 2014/0356635 A1* | 12/2014 | Kim | .................. | H01L 23/49822 |
| | | | | 428/433 |
| 2014/0374901 A1* | 12/2014 | Huishu | ................... | H01L 23/60 |
| | | | | 257/737 |
| 2017/0323853 A1* | 11/2017 | Hu | ........................ | H01L 21/486 |
| 2019/0139843 A1* | 5/2019 | Shigeta | ................... | H01L 24/20 |
| 2019/0304901 A1* | 10/2019 | Hwang | ............... | H01L 23/3128 |
| 2020/0006290 A1* | 1/2020 | Chang Chien | ...... | H01L 21/6835 |
| 2020/0058622 A1* | 2/2020 | Chen | ...................... | H01L 24/80 |
| 2020/0203287 A1* | 6/2020 | Krefft | .................... | H01L 25/16 |
| 2020/0243461 A1* | 7/2020 | Chiang | ................. | H01L 21/565 |

* cited by examiner

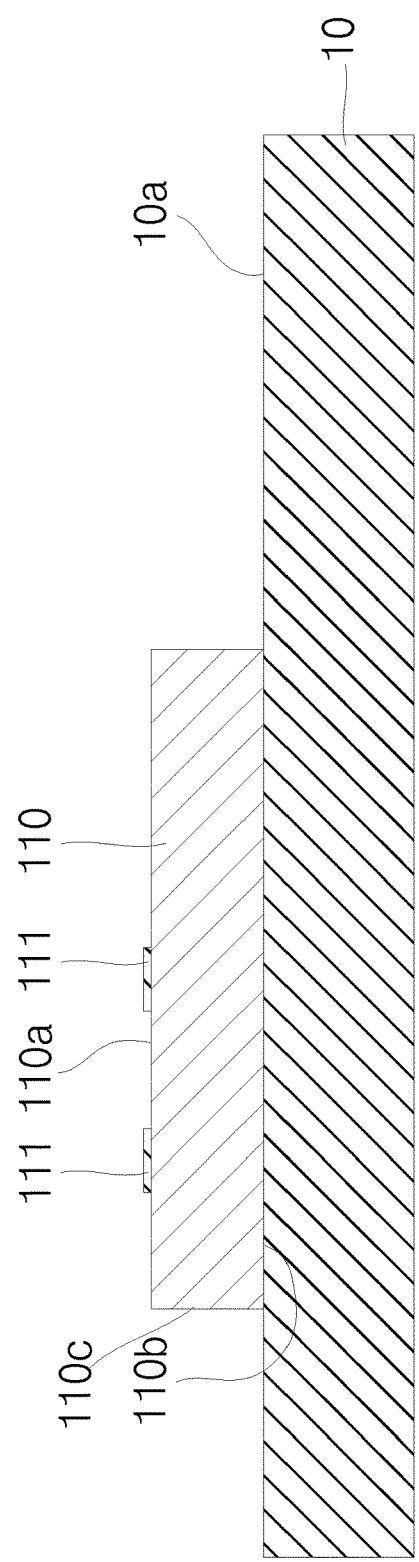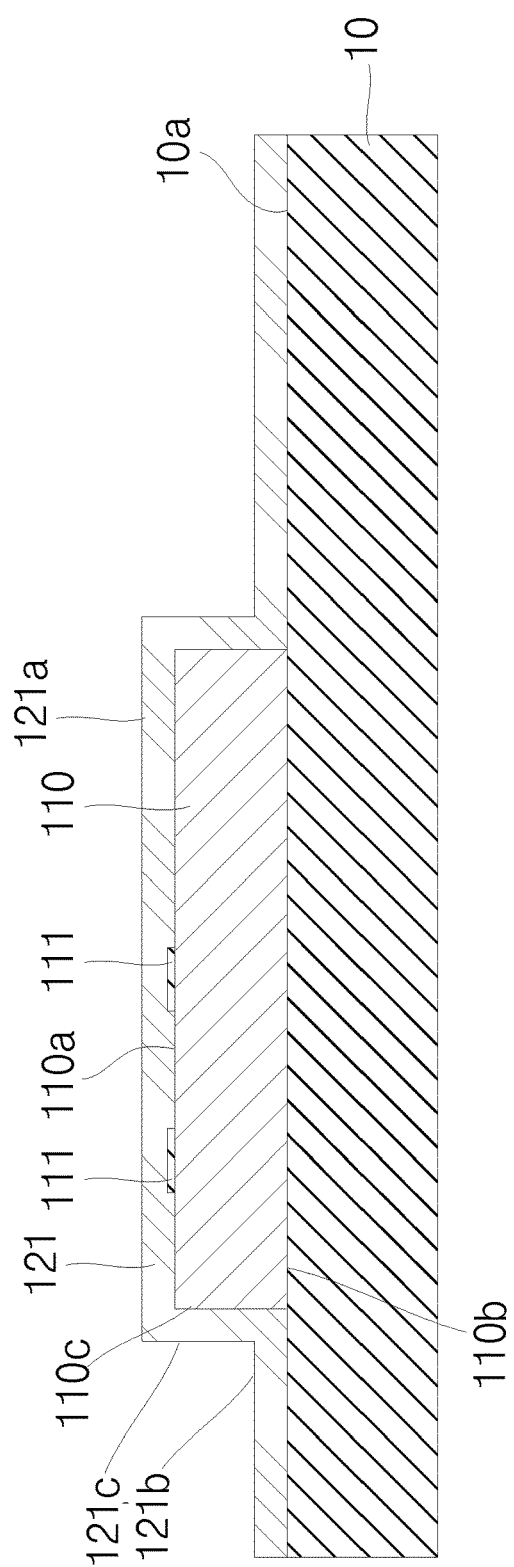

SEMICONDUCTOR DEVICE AND METHOD OF MANUFACTURING A SEMICONDUCTOR DEVICE

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2H show cross-sectional views of an example method for manufacturing an example semiconductor device.

Figure 1:
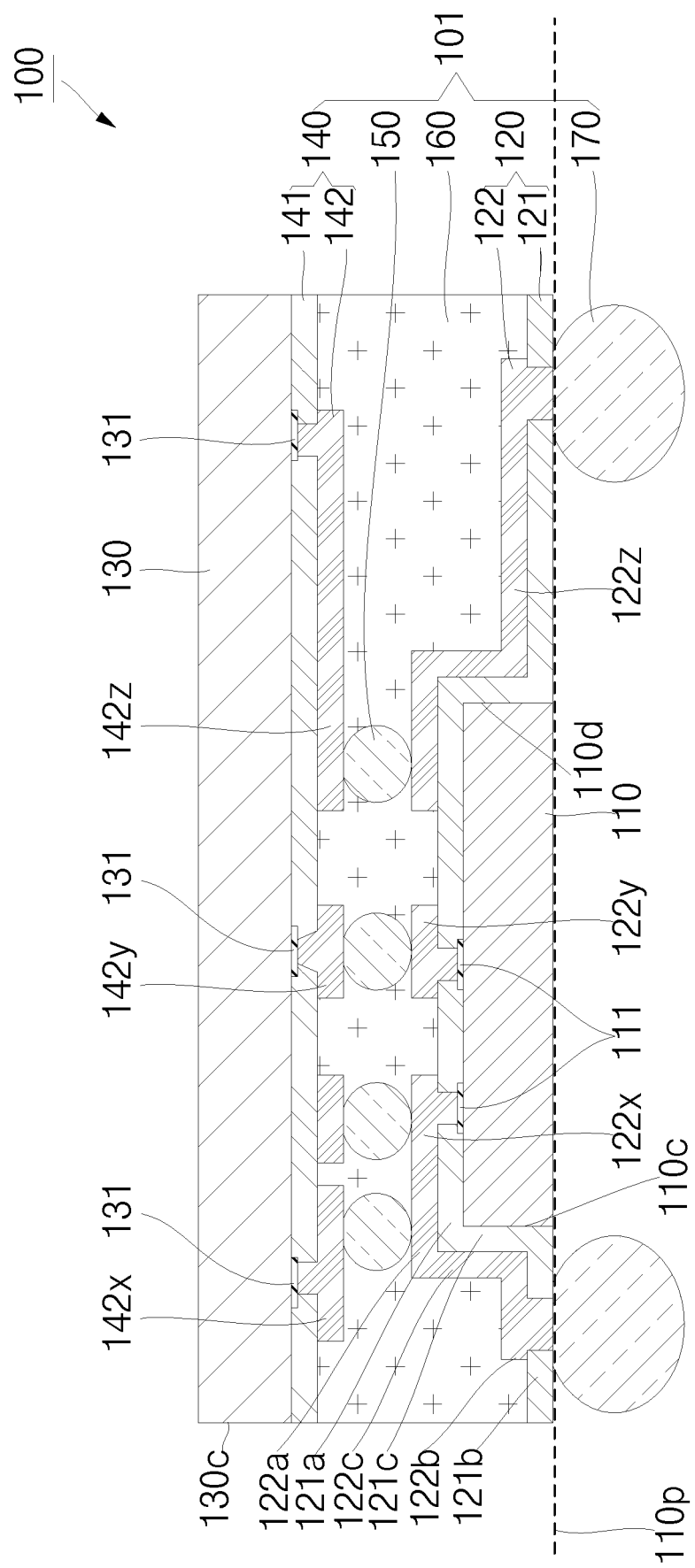
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device can comprise (a) an electronic device comprising a device top side comprising a device first terminal, a device bottom side opposite the device top side, and a device first sidewall between the device top side and the device bottom side, and (b) a substrate. The substrate can comprise a dielectric material comprising (a) a dielectric top section over the device top side, wherein the dielectric top section comprises a dielectric first opening over the device first terminal (b) a dielectric side section over the device first sidewall and continuous with the dielectric top section, and (c) a dielectric bottom section comprising a lower surface substantially coplanar with the device bottom side and continuous with the dielectric side section. The substrate can also comprise a first conductive material comprising (a) a first conductive top section over the dielectric top section and coupled to the device first terminal through the dielectric first opening, (b) a first conductive side section over the dielectric side section and continuous with the first conductive top section, and (c) a first conductive bottom section over the dielectric bottom section and continuous with the first conductive side section.

In one example, a semiconductor device can comprise (a) an electronic device comprising a device top side, a device bottom side opposite the device top side, and a device sidewall between the device top side and the device bottom side, (b) a first conductor comprising, a first conductor side section on the device sidewall, a first conductor top section on the device top side and coupled to the first conductor side section, and a first conductor bottom section coupled to the first conductor side section, and (c) a protective material covering the first conductor and the electronic device. A lower surface of the first conductor top section can be higher than the device top side, and an upper surface of the first conductor bottom section can be lower than the device top side.

In one example, a method can comprise (a) providing an electronic device comprising a device top side comprising a device first terminal, a device bottom side opposite the device top side, and a device first sidewall between the device top side and the device bottom side, and (b) providing a dielectric comprising a dielectric top section over the device top side, wherein the dielectric top section comprises a dielectric first opening over the device first terminal, a dielectric side section over the device first sidewall and continuous with the dielectric top section, and a dielectric bottom section continuous with the dielectric side section. A lower surface of the dielectric bottom section can be substantially coplanar with the device bottom side. An upper surface of the dielectric bottom section can be lower than an upper surface of the dielectric top section.

Other examples are included in the present disclosure. Such examples may be found in the figures, in the claims, and/or in the description of the present disclosure.

FIG. 1 shows a cross-sectional view of an example semiconductor device 100. In the example shown in FIG. 1, semiconductor device 100 can comprise electronic device 110, electronic component 130, substrates 120 and 140, interconnects 150 and 170, and an encapsulant 160.

Electronic device 110 can comprise terminals 111. Terminals 111 can be formed on a top surface of electronic device 110. Substrate 120 can comprise a dielectric structure 121 and a conductive structure 122. Conductive structure 122 can be electrically connected to terminals 111 of electronic device 110.

Electronic component 130 can comprise terminals 131. Terminals 131 can be formed on a bottom surface of electronic component 130. Substrate 140 can comprise a dielectric structure 141 and a conductive structure 142. Conductive structure 142 can be electrically connected to terminals 131 of electronic component 130. Substrate 140 can be formed on the bottom surface of electronic component 130.

Interconnects 150 can be formed of a conductive material and can electrically connect conductive structure 142 and conductive structure 122. Interconnects 170 can be formed of a conductive material and can be formed on the bottom surface of substrate 140. Interconnects 170 can be electrically connected to conductive structure 142. Encapsulant 160 can be interposed between the top surface of substrate 120 and the bottom surface of substrate 140.

Substrates 120 and 140, interconnects 150 and 170, and encapsulant 160 can comprise or be referred to as a semiconductor package 101, which can provide protection for electronic device 110 and electronic component 130 from external elements and/or environmental exposure. In addition, semiconductor package 101 can provide electrical coupling between external electrical components and terminals 111 and 131.

FIGS. 2A to 2H show cross-sectional views of an example method for manufacturing semiconductor device 100.

FIG. 2A shows a cross-sectional view of semiconductor device 100 at an early stage of manufacture. In the example shown in FIG. 2A, electronic device 110 can be mounted on a top surface 10a of carrier 10. Here, a portion of the top surface 10a of carrier 10 can be exposed. Examples of carrier 10 can comprise silicon, low grade silicon, glass, silicon carbide, sapphire, quartz, ceramic, metal oxide, metal and so on.

A device bottom side 110b of electronic device 110 can be secured to the top surface 10a of carrier 10, for example, using an adhesive between device bottom side 110b and top surface 10a. In some examples, the adhesive can be a liquid-phase epoxy adhesive, an adhesive film, or an adhesive tape.

In some examples, electronic device 110 can comprise or be referred to as an electronic component, a semiconductor die, or a semiconductor package. Electronic device 110 can comprise, for example, a semiconductor material, such as silicon (Si). Electronic device 110 can comprise a plurality of terminals 111 provided on its device top side 110a. Electronic device 110 can comprise passive electronic circuits and/or or active electronic circuits, such as transistors. Electronic device 110 can have a thickness in the range from approximately 75 μm to approximately 775 μm. Carrier 10 can facilitate handling of electronic device 110 in the following manufacturing process and can protect electronic device 110.

In some examples, terminals 111 can comprise or be referred to as die pads. Terminals 111 can comprise, for example, electrically conductive materials, such as a metallic material, aluminum, copper, an aluminum alloy or a copper alloy.

FIG. 2B shows a cross-sectional view of semiconductor device 100 at a later stage of manufacture. In the example shown in FIG. 2B, dielectric structure 121 can be formed to cover the top surface 10a of carrier 10 and the exposed surface of electronic device 110 to a substantially uniform thickness. Dielectric structure 121 comprises substantially horizontal dielectric top section 121a over device top side 110a, substantially horizontal dielectric bottom section 121b extending over carrier 10 or device bottom plane 110p, and substantially vertical dielectric side section 121c over device sidewall 110c. Device bottom plane 110p can be defined by device bottom side 110b. An upper surface of dielectric bottom section 121b can be exposed from dielectric top section 121a. A lower surface of dielectric bottom section 121b can be substantially coplanar with device bottom side 110b. An upper surface of dielectric bottom section 121b can be lower than an upper surface of dielectric top section 121a, or lower than a lower surface of dielectric top section 121a. Dielectric top section 121a and dielectric bottom section 121b can each be connected or continuous with dielectric side section 121c. Dielectric 121 can be applied or formed conformally to carrier 10 and electronic device 110, such as to acquire or conform to the contour or combined shape of electronic device 110 and carrier 10.

Dielectric structure 121 can have a thickness in the range from 5 μm to 10 μm. In some examples, dielectric structure 121 can comprise or be referred to as a dielectric, a dielectric layer, a dielectric material, a non-conductive material, or an insulator. Dielectric structure 121 can comprise, for example, an insulating material, such as a polymer, polyimide (PI), benzocyclobutene (BCB), polybenzoxazole (PBO), bismaleimide triazine (BT), a molding material, a phenolic resin, an epoxy, silicone, or an acrylate polymer. Examples for forming dielectric structure 121 can comprise using spin coating, spray coating, printing, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), sheet lamination, or evaporation.

Figure 2C:
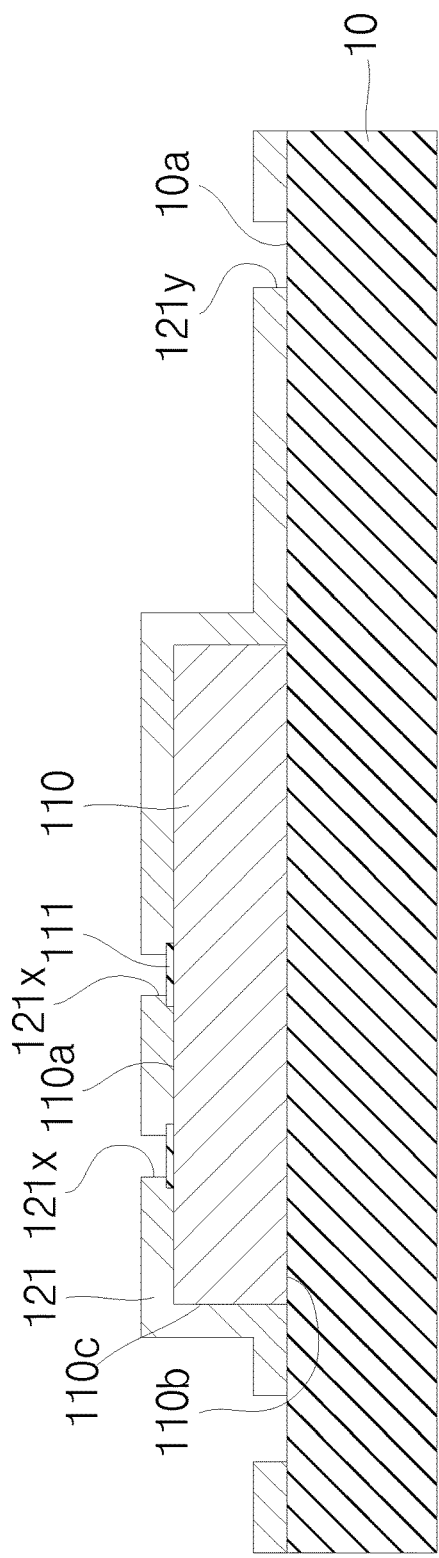

FIG. 2C shows a cross-sectional view of semiconductor device 100 at a later stage of manufacture. In the example shown in FIG. 2C, openings 121x exposing terminals 111 can be formed by patterning dielectric structure 121. Openings 121y exposing a portion of the top surface 10a of carrier 10 can also be formed at this stage. For example, after forming a mask pattern that exposes regions of dielectric structure 121 corresponding to openings 121x and openings 121y, such exposed regions of dielectric structure 121 can be removed, such as by etching, thereby forming openings 121x and openings 121y. Photoresist can be used as mask pattern.

In some examples, openings 121x and 121y can comprise or be referred to as apertures or vias. Openings 121x can have a smaller perimeter than terminals 111. Accordingly, dielectric structure 121 can cover or remain over portions of outer perimeters of terminals 111. Openings 121y can have a planar size in the range from approximately 10 μm to approximately 100 μm.

Figure 2D:
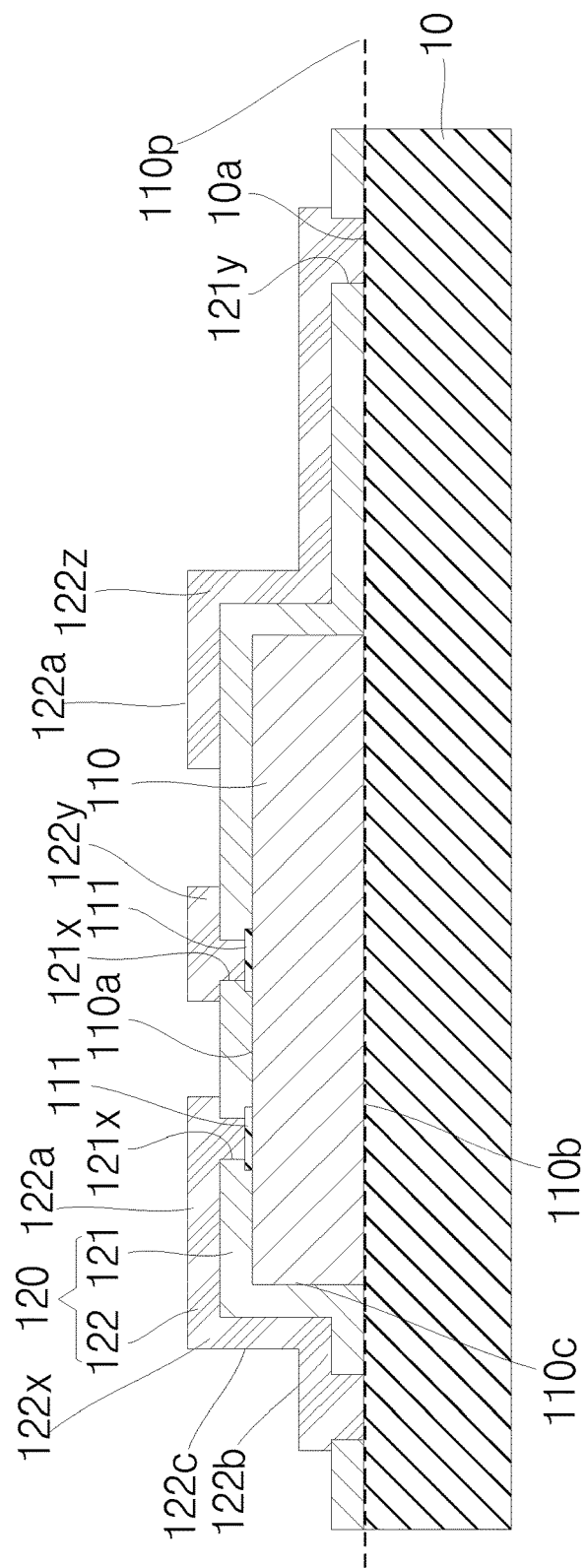

FIG. 2D shows a cross-sectional view of semiconductor device 100 at a later stage of manufacture. In the example shown in FIG. 2D, conductive structure 122 can be formed to cover openings 121x, openings 121y and the exposed surface of dielectric structure 121.

Conductive structure 122 can comprise or be referred to as one or more conductive materials, conductors or conductive layers, patterns or traces, such as conductors 122x, 122y, and 122z. In the present example, conductors 122x, 122x, and 122z can be formed from a single conductive layer that can be defined by one or more conductive sublayers such as, for example, a principal sublayer over a seed sublayer. Conductors 122x, 122x, or 122z can be similar to each other, and can comprise respective conductor top sections, conductor side sections 122c, or conductor bottom sections 122b adjacent respective sides of electronic device 110. Conductors 122x and 122y extend over device top side 110a of electronic device 110, and each can have a first terminal portion connected to respective terminals 111 exposed through respective openings 121x. Conductor 122x also has a second terminal portion that is exposed and/or extends through respective opening 121y of dielectric structure 121. The first and second terminal portions of conductor 122x are linked to each other by a conductive path of conductor 122x. Conductor 122x is on dielectric structure 121 and comprises conductor top section 122a that extends substantially horizontally over dielectric top section 121a and device top side 110a, conductor side section 122c that extends substantially vertically over dielectric side section 121c and device sidewall 110c, and conductor bottom section 122b that extends substantially horizontally past the perimeter of electronic device 110 over dielectric bottom section 121b and over carrier 10. Conductor top section 122a and conductor bottom section 122b, can each be connected or continuous with conductor side section 122c. In some examples, conductor side section 122c can be substantially orthogonal to conductor top section 122a and to conductor bottom section 122b. In some examples, conductor top section 122a and conductor bottom section 122b do not substantially overlap each other. In some examples, an upper surface of conductor bottom section 122b can be closer to device bottom plane 110p than a lower surface of conductor top section 122a. In some examples, a lower surface of conductor top section 122a can be higher than device top side 110a, and an upper surface of conductor bottom section 122b can be substantially parallel to the lower surface of conductor top section 122a but lower than device top side 110a.

Conductor 122z also extends and has a first terminal portion over device top side 110a of electronic device 110, but as shown in the present example conductor 122z need not be connected to electronic device 110 or any terminal 111. Conductor 122z also has a second terminal portion that is exposed and/or extends through respective opening 121y of dielectric structure 121. The first and second terminal portions of conductor 122z are linked to each other by a conductive path of conductor 122z, where such conductive path is on dielectric structure 121 and extends substantially horizontally over device top side 110a of electronic device 110, substantially vertically over device sidewall 110c of electronic device 110, and substantially horizontally over carrier 10 further past the perimeter of electronic device 110.

Although the present example is illustrated for simplicity with a single conductive structure 122 and a single dielectric structure 121, such elements can respectively represent one or more conductive structures or layers and/or one or more dielectric structures or layers that may be alternatingly stacked over each other. In the same or other examples, one or more portions of conductive structure 122 can have or can be formed with one or more layers of one or more conductive materials stacked on each other.

Conductive structure 122 can have a thickness in the range from approximately 3 μm to approximately 10 μm. In some examples, conductive structure 122 can comprise an electrically conductive material such as, for example, titanium (Ti), titanium-tungsten (TiW), copper (Cu), or alloys of Ti, TiW, or Cu.

Examples for forming conductive structure 122 can comprise using physical vapor deposition (PVD), chemical vapor deposition (CVD), atomic layer deposition (ALD), plasma vapor deposition, electroless plating, or electrolytic plating. In some examples, PVD can comprise or be referred to as sputtering.

Conductors 122x, 122y, or 122z of conductive structure 122, or their respective conductor top sections 122a, conductor side sections 122c, or conductor bottom sections 122b, can be applied or formed simultaneously or conformally to carrier 10 and electronic device 110, such as to acquire or conform to the contour or combined shape of dielectric 121, electronic device 110, or carrier 10.

Figure 2E:
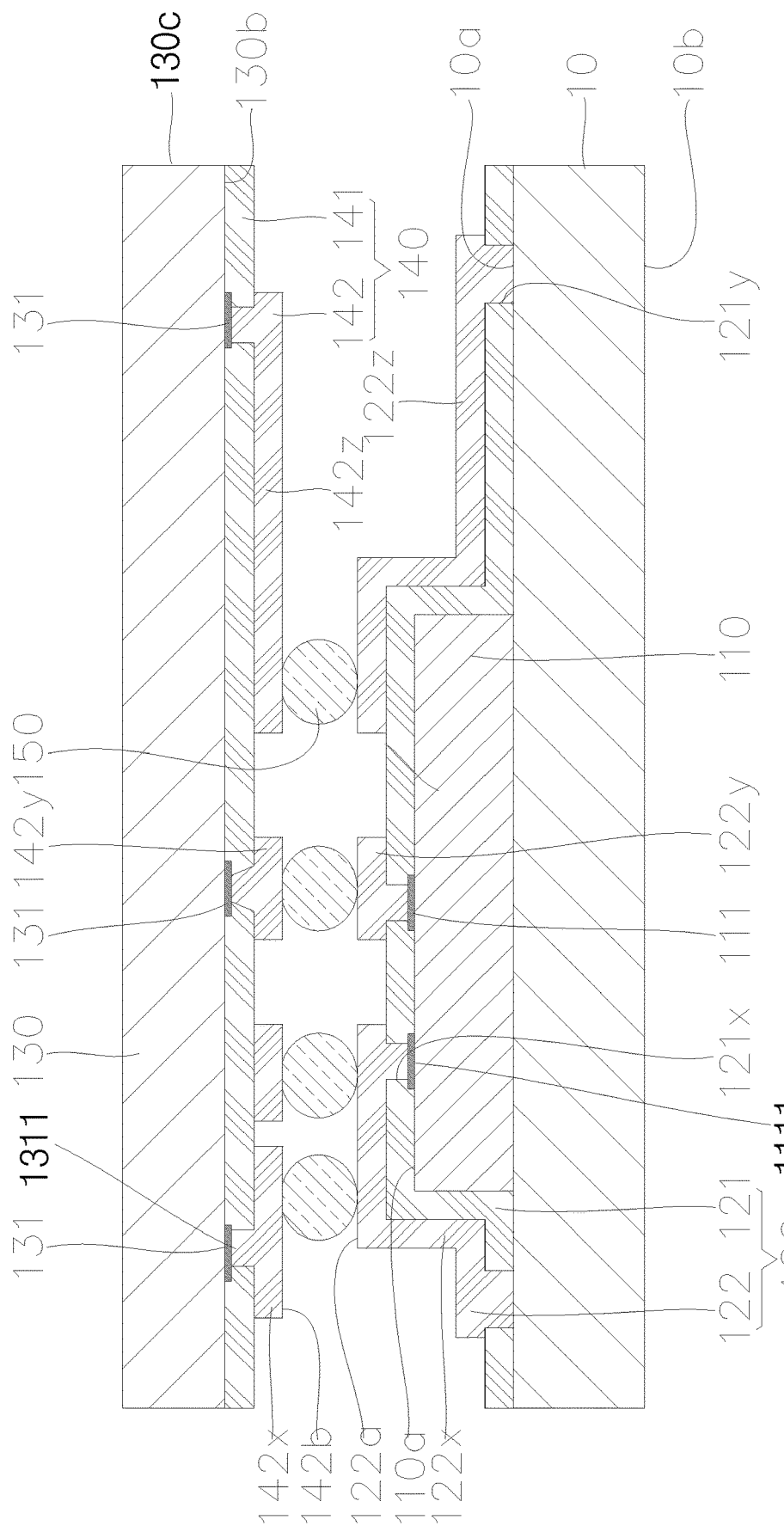

FIG. 2E shows a cross-sectional view of semiconductor device 100 at a later stage of manufacture. In the example shown in FIG. 2E, electronic component 130 having substrate 140 and internal interconnects 150 on bottom side 130b of the electronic component 130 can be mounted on conductive structure 122. Electronic component 130 can comprise be referred to as an electronic device, a semiconductor die, a semiconductor package, and/or an interposer. Electronic component 130 can comprise, for example, a semiconductor material, such as silicon (Si). Electronic component 130 can comprises a plurality of terminals 131 provided on its bottom side 130b. Electronic component 130 can comprise passive electronic circuits and/or active electronic circuits such as transistors. Electronic component 130 can have a thickness in the range from approximately 75 μm to approximately 775 μm.

Substrate 140 and interconnects 150 can be further provided on the bottom side 130b of electronic component 130. Substrate 140 can comprise dielectric structure 141 covering bottom side 130b of electronic component 130 and exposing terminals 131, and conductive structure 142 electrically connected to terminals 131 exposed through dielectric structure 141. In some examples, substrate 140, dielectric structure 141, and/or conductive structure 142 can be similar to substrate 120, dielectric structure 121, and/or conductive structure 122. Conductive structure 142 can have a plurality of conductors, patterns, or traces that extend over bottom side 130b of electronic component 130. For example, each of component conductors 142x, 142y, and 142z can have a respective first terminal portion to which a corresponding interconnect 150 is coupled, a respective second terminal portion coupled to a corresponding terminal 131 of electronic component 130 exposed through dielectric structure 141, and respective conductive paths that link together the corresponding first and second terminal portions of each of conductors 142x, 142y, and 142z. In the present example, respective interconnects 150 couple together conductor 142x to conductor 122x, conductor 142y to conductor 122y, and conductor 142z to conductor 122z. For instance, interconnect 1501 is coupled to conductor top section 122a, and coupled to component terminal 1311 through component conductor 142x. In addition, component terminal 1311 is coupled to device terminal 1111 through interconnect 1501, conductor top section 122a, and dielectric opening 121x. In the present example, component dielectric structure 141 is located on component bottom side 130b, leaving component terminal 1311 exposed, and conductor 142x extends laterally from component terminal 1311 over component dielectric structure 141 such that component terminal 1311 is laterally offset from interconnect 1501. Furthermore, internal interconnect 1501 is coupled along conductor top section 122a, such that it is laterally offset from device terminal 1111. In some examples, internal interconnects 150 can be coupled to respective conductors of conductive structure 142, and/or to respective conductors of conductive structure 122, through respective terminals such as pads and/or under-bump metallization (UBM) formed on such respective conductors.

Conductive structure 142 that constitutes substrate 140 together with dielectric structure 141 can be a wiring for redistributing electrical connections of terminals 131 of electronic component 130. Conductive structure 142 can have a thickness in the range from approximately 3 μm to approximately 10 μm, and dielectric structure 141 can have a thickness in the range from approximately 5 μm to approximately 10 μm.

Dielectric structure 141 can comprise or be referred to as, for example, one or more dielectric layers, non-conductive materials or insulators. Dielectric structure 141 can comprise, for example, an insulating material, such as a polymer, polyimide (PI), benzocyclobutene (BCB), polybenzoxazole (PBO), bismaleimide triazine (BT), a molding material, a phenolic resin, an epoxy, silicone, or an acrylate polymer. Examples for forming dielectric structure 141 can comprise using spin coating, spray coating, printing, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), sheet lamination, or evaporation. In addition, dielectric structure 141 can be exposed by etching portions where terminals 131 of electronic component 130 are formed.

In some examples, conductive structure 142 can comprise an electrically conductive material such as, for example, titanium (Ti), titanium-tungsten (TiW), copper (Cu), or alloys of Ti, TiW, or Cu. Examples for forming conductive structure 142 can comprise using physical vapor deposition (PVD), chemical vapor deposition (CVD), atomic layer deposition (ALD), plasma vapor deposition, electroless plating, or electrolytic plating. In some examples, PVD can comprise or be referred to as sputtering. In addition, conductive structure 142 can be patterned using a mask pattern to provide a plurality of patterns electrically connected to terminals 131, respectively.

Interconnects 150 can be electrically connected to the bottom surface 142b of conductive structure 142. Interconnects 150 can be equally sized. Interconnects 150 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, interconnects 150 can comprise a solder ball, and/or a metal-core ball having a solid metal core covered by solder. In some examples interconnects 150 can comprise a metallic pillar, such as a copper pillar, that can be placed or formed on conductive structure 142, and which may have a solder tip or end. Interconnects 150 can have a size in the range from approximately 5 μm to approximately 100 μm.

Examples for forming interconnects 150 include using a ball drop process, a screen-printing process, or an electroplating process. In some examples, an electrically conductive material comprising solder can be formed on bottom surface of conductive structure 142 using a solder ball drop process. Here, the bottom surface 142b of conductive structure 142 can be disposed to face upward. A reflow process can be used to heat electronic component 130 and substrate 140 to a predetermined temperature and the shapes of interconnects 150 can change during the reflow.

In some examples, electronic component 130 having substrate 140 and interconnects 150 can be electrically connected to conductive structure 122 of substrate 120 using a mass reflow process, a thermal compression process or a laser bonding process. Interconnects 150 can be interposed between conductive structure 122 and conductive structure 142 to electrically connect substrate 120 and substrate 140. Interconnects 150 can route electrical current or signals between electronic device 110 and electronic component 130 through substrate 120 and substrate 140. In addition, one or more interconnects 150 can be connected to conductors that are not electrically connected to electronic device 110, such as conductor 122z. In some examples, interconnects 150 can electrically connect electronic component 130 to electronic device 110 through substrate 140 and substrate 120. In the same or other examples, one or more interconnect 150 can electrically connect electronic component 130 to a conductor of conductive structure 122 that extends past the perimeter of electronic device 110 that and is exposed through openings 121y of dielectric structure 121.

In some examples, one or more of the substrates that can be used as part of semiconductor device 100, such as substrate 140 or 120, can be redistribution layer ("RDL") substrates. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

In some examples, one or more of the substrates that can be used as part of semiconductor device 100, such as substrate 140, can be pre-formed substrates. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

Figure 2F:
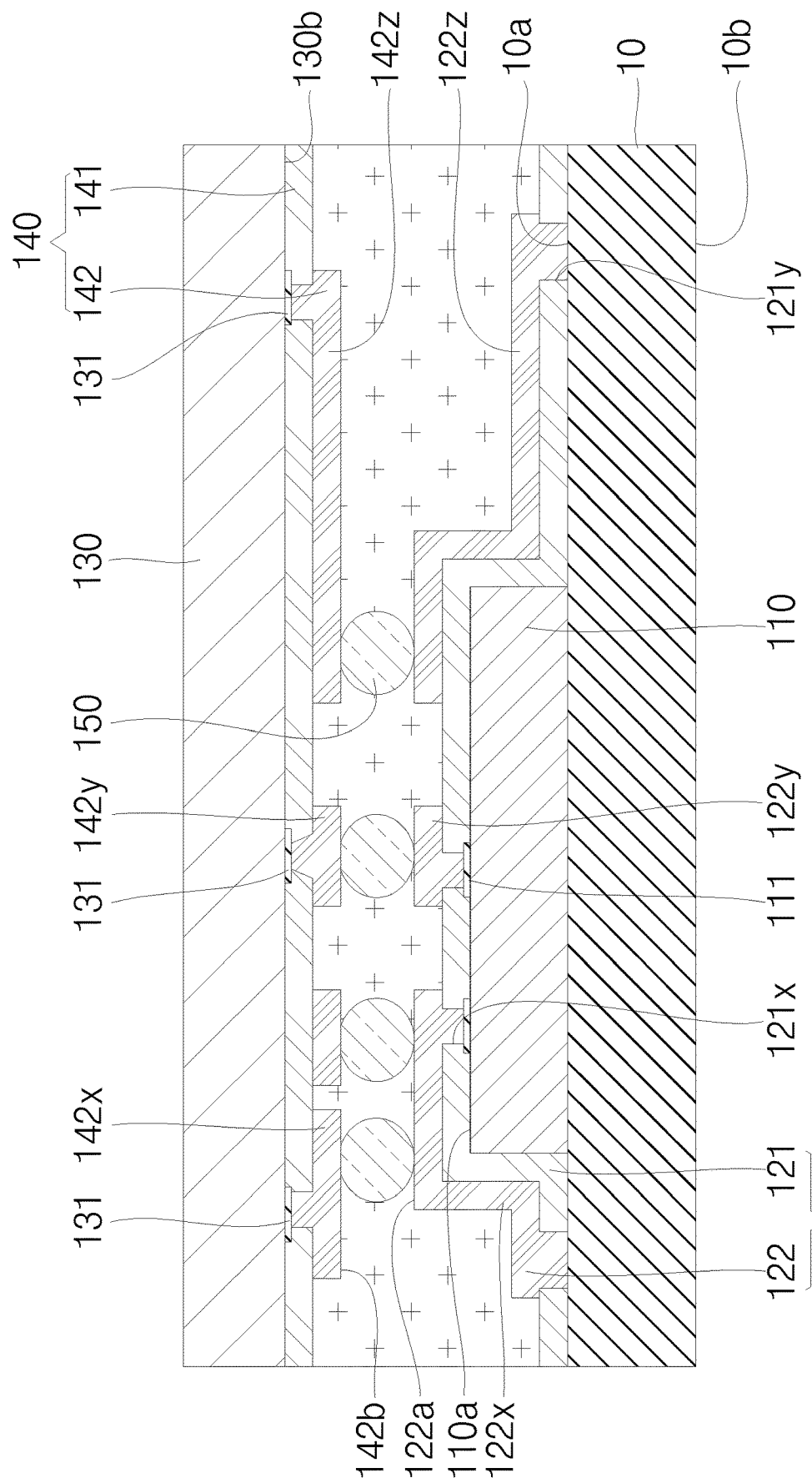

FIG. 2F shows a cross-sectional view of semiconductor device 100 at a later stage of manufacture. In the example shown in FIG. 2F, encapsulant 160 can be formed to cover the top of substrate 120, the bottom of semiconductor component 130 and substrate 140, electronic device 110, and interconnects 150. The sidewalls of electronic device 110, including device sidewall 110c, are at least partially bounded by encapsulant 160. Encapsulant 160 can be provided to entirely fill the area between substrate 120 and substrate 140.

In some examples, encapsulant 160 can comprise an electrically non-conductive material, a resin, a polymer composite material, a polymer having a filler, an epoxy resin, an epoxy resin, an epoxy acrylate having a filler such as silica or other inorganic material, a silicone resin, or a resin-impregnated B-state pre-preg film.

Examples for forming encapsulant 160 can comprise compression molding, transfer molding, liquid encapsulant molding, vacuum lamination, paste printing, or film assisted molding. In some examples, encapsulant 160 can comprise or be referred to as a protective material or a mold compound. Encapsulant 160 can electrically disconnect substrate 120, substrate 140 and interconnects 150 from one another, thereby protecting substrate 120, substrate 140 and interconnects 150 from external circumferences.

Figure 2G:
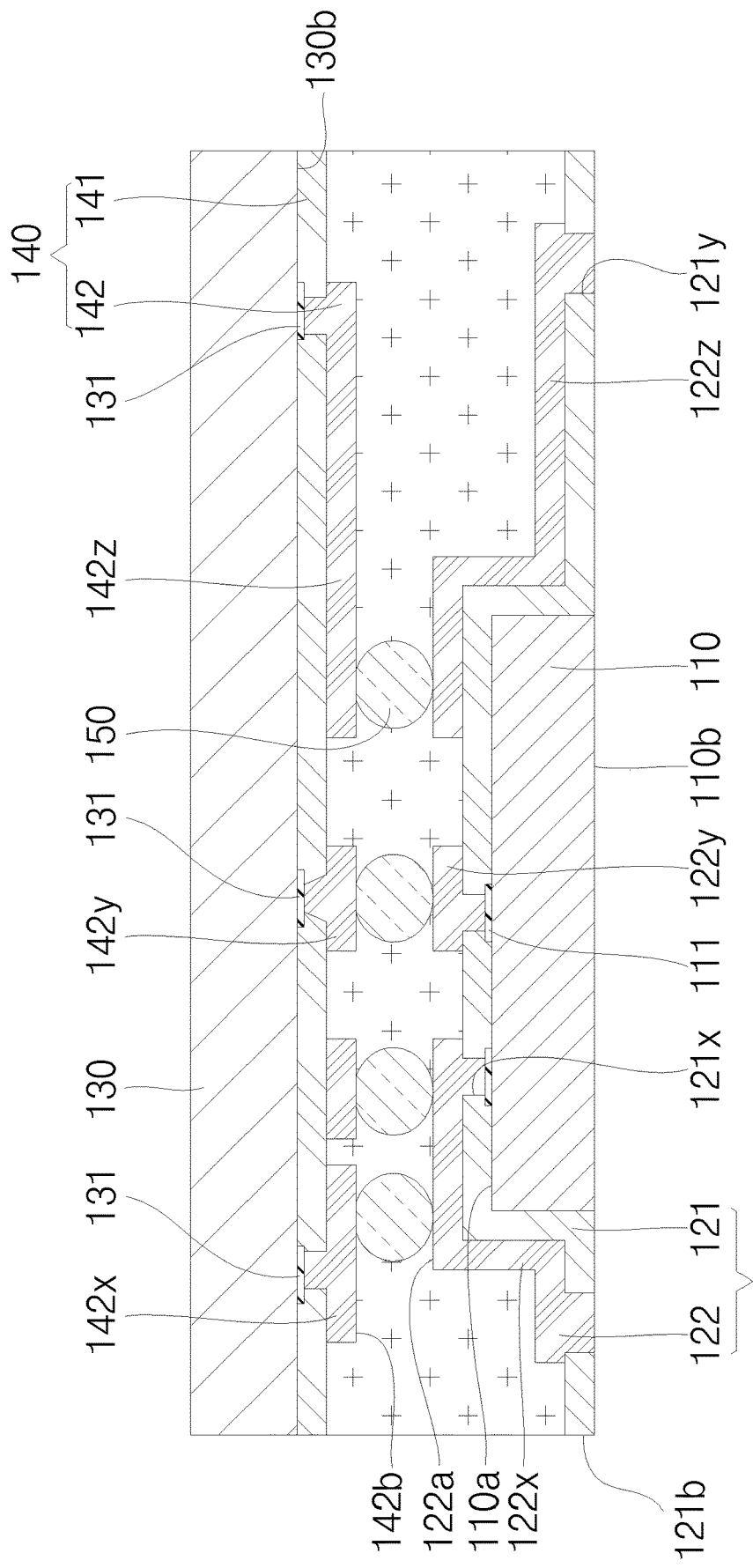

FIG. 2G shows a cross-sectional view of semiconductor device 100 at a later stage of manufacture. In the example shown in FIG. 2G, carrier 10 adhered to the device bottom side 110b of electronic device 110 can be removed to allow the device bottom side 110b of electronic device 110 and the bottom surface of substrate 120 to be exposed. As carrier 10 is removed, the bottom surface 121b of dielectric structure 121 formed on the top surface 10a of carrier 10 can be exposed. In addition, if carrier 10 is removed, conductive structure 122 formed on the top surface 10a of carrier 10 can also be exposed through openings 121y of dielectric structure 121. Conductors of conductive structure 122 which are not electrically connected to electronic device 110, such as conductor 122z, can also be exposed through openings 121y.

Carrier 10 can be removed by general grinding or chemical etching. Alternatively, carrier 10 can also be removed by a release process using UV radiation or laser.

Figure 2H:
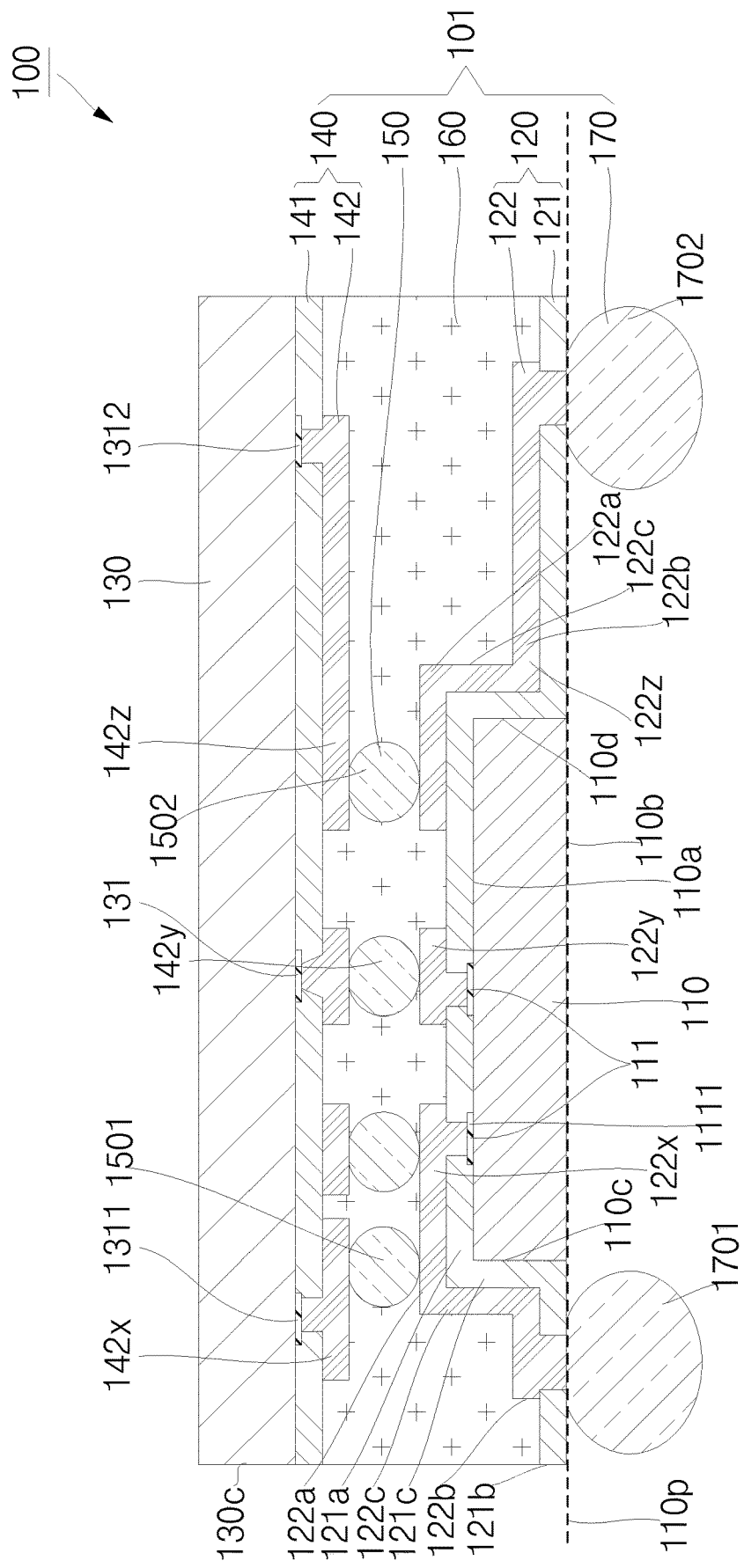

FIG. 2H shows a cross-sectional view of semiconductor device 100 at a later stage of manufacture. In the example shown in FIG. 2H, interconnects 170 can be provided on conductive structure 122 exposed through openings 121y.

Interconnects 170 can be electrically connected to the bottom surface of conductive structure 122. In some examples, interconnects 170 can be electrically connected to electronic device 110 through conductive structure 122. In some examples, interconnects 170 can be electrically connected to electronic component 130 through conductive structure 122, interconnects 150 and conductive structure 142. Interconnects 170 can be referred as external interconnects, permitting external connections from semiconductor device 100 to external devices or components such as printed circuit boards or substrates.

Interconnects 170 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. Examples for forming interconnects 170 include using a ball drop process, a screen-printing process, or an electroplating process. In some examples, an electrically conductive material comprising solder can be formed on the bottom surface 122b of conductive structure 122 using a solder ball drop process. The bottom surface 122b of conductive structure 122 can be disposed to face upward at this stage. A reflow process can be used to heat semiconductor device 100 to a predetermined temperature and the shapes of interconnects 170 can change during the reflow process. Electrical interconnects 170 can comprise or be referred to as conductive balls, such as solder balls, conductive pillars, such as copper pillars, or conductive posts having solder caps formed on copper pillars. Interconnects 170 can have a size in the range from approximately 60 µm to approximately 150 µm.

Interconnects 170 can permit external access to and/or from one or more elements of semiconductor device 100, such as electronic device 110 and/or electronic component 130.

For example, in a first path adjacent sidewall 110c of electronic device 110, interconnect 1701 on the bottom of substrate 120 is coupled to component terminal 1311 of electronic component 130 through a route that includes conductor 122x (including conductor bottom section 122b, conductor side section 122c, and conductor top section 122a), through interconnect 1501, and through component conductor 142x. Also in the present example, interconnect 1701 on the bottom of substrate 120 is coupled to device terminal 1111 of electronic device 130 also along at least part of the first path, through a route that includes conductor 122x (including conductor bottom section 122b, conductor side section 122c adjacent sidewall 110c, and conductor top section 122a).

Similarly, in a second path adjacent sidewall 110d of electronic device 110, interconnect 1702 on the bottom of substrate 120 is coupled to component terminal 1312 of electronic component 130 through a route that includes conductor 122z (and its respective conductor top section 122a, conductor side section 122c, and conductor bottom section 122c), through interconnect 1502, and through component conductor 142z.

Semiconductor device 100 is presented in its final form, after singulation into an individual unit. Such singulation can be achieved, for example by sawing to define the sidewalls of semiconductor device 100. In some examples, such singulation can define coplanar portions of different elements of semiconductor device 100. For example, component sidewall 130c of electronic component 130 can be substantially coplanar with the sidewall of encapsulant 160. In some examples the sidewall of substrate 120, shown in FIG. 2H as an outer end or sidewall of dielectric bottom section 121b, is exposed from and substantially coplanar with the sidewall of encapsulant 160. In some examples, as shown in FIG. 2H, an outer conductor endpoint of conductor bottom section 122b is not exposed from encapsulant 160, but rather covered by it. Such endpoint of conductor bottom section 122b can be closest to the sidewall of encapsulant 160 than any other point of conductive bottom section 122b. There can be other examples where the outer end of conductor bottom section 122b could extend further and thus be exposed coplanar with the sidewall of encapsulant 160.

As a result of the arrangements described above for interconnecting the different conductors of conductive structures 122 and 142, several signal paths can be accomplished for semiconductor device 100. For example, the path including conductors 122x and 142x permits electronic device 110 and electronic component 130 to be electrically connected to each other and to a corresponding interconnect 170 for external connection off semiconductor device 100. The path including conductors 122y and 142y permits direct internal connection between electronic devices 110 and electronic component 130. The path including conductors 122z and 142z permits electronic device 130 to be electrically connected to a corresponding interconnect 170, traversing over but electrically bypassing electronic device 100, for external connection off semiconductor device 100. Accordingly, electrical coupling between top electronic device 130 and external interconnect 170 can be achieved without requiring additional formation of a dedicated vertical via that would otherwise have to extend fully from top to bottom of encapsulant 160 between electronic device 130 and external interconnect 170.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A semiconductor device comprising:
   an electronic device comprising:
      a device top side comprising a device first terminal;
      a device bottom side opposite the device top side; and
      a device first sidewall between the device top side and the device bottom side; and
   a substrate comprising:
      a dielectric material comprising:
         a dielectric top section over the device top side, wherein the dielectric top section comprises a dielectric first opening over the device first terminal;
         a dielectric side section over the device first sidewall and continuous with the dielectric top section; and
         a dielectric bottom section comprising a lower surface substantially coplanar with the device bottom side and continuous with the dielectric side section;
      and
      a first conductive material comprising:
         a first conductive top section over the dielectric top section and coupled to the device first terminal through the dielectric first opening;
         a first conductive side section over the dielectric side section and continuous with the first conductive top section; and
         a first conductive bottom section over the dielectric bottom section and continuous with the first conductive side section.

2. The semiconductor device of claim 1, wherein:
   the device bottom side defines a device bottom plane; and
   an upper surface of the first conductive bottom section is closer to the device bottom plane than a lower surface of the first conductive top section.

3. The semiconductor device of claim 1, wherein:
   the first conductive side section is substantially orthogonal to the first conductive top section and to the first conductive bottom section; and
   the first conductive top section and the first conductive bottom section do not substantially overlap each other.

4. The semiconductor device of claim 1, further comprising:
   an encapsulant over the substrate, bounding the device first sidewall, and comprising an encapsulant first sidewall;
   wherein:
      the dielectric bottom section comprises a dielectric first end exposed from and substantially coplanar with the encapsulant first sidewall; and
      the first conductive bottom section comprises a first conductive endpoint covered by the encapsulant first sidewall, the first conductive endpoint being closer to the encapsulant first sidewall than any other point of the first conductive bottom section.

5. The semiconductor device of claim 1, further comprising:
   an electronic component comprising:
      a component bottom side;
      a component first terminal on the component bottom side; and
      a component sidewall;
   and
   a first internal interconnect over the first conductive top section and coupled to the component first terminal.

6. The semiconductor device of claim 5, wherein:
   the electronic component comprises:
      a component dielectric material over the component bottom side and exposing the component first terminal; and
      a component conductive material over the component dielectric material, extending laterally from the component first terminal, and coupling the component first terminal to the first internal interconnect.

7. The semiconductor device of claim 5, further comprising:
   an encapsulant extending between the component bottom side and the substrate, bounding the device first sidewall and the first internal interconnect, and comprising an encapsulant first sidewall;

wherein the encapsulant first sidewall is substantially coplanar to the component sidewall and to a sidewall of the dielectric material.

8. The semiconductor device of claim 5, wherein:
the component first terminal is coupled to the device first terminal, through the dielectric first opening, by the first internal interconnect and the first conductive top section.

9. The semiconductor device of claim 8, wherein:
the first internal interconnect is laterally offset from the component first terminal and from the device first terminal.

10. The semiconductor device of claim 5, further comprising:
a first external interconnect on a bottom of the substrate;
wherein the component first terminal is coupled to the first external interconnect by the first internal interconnect, the first conductive top section, the first conductive side section, and the first conductive bottom section of the substrate.

11. The semiconductor device of claim 10, wherein:
the component first terminal is coupled to the device first terminal, through the dielectric first opening, by the first internal interconnect and the first conductive top section.

12. The semiconductor device of claim 1, wherein:
the electronic device comprises:
a device second sidewall between the device top side and the device bottom side;
the dielectric side section extends over the device second sidewall; and
the substrate comprises a second conductive material comprising:
a second conductive top section over the dielectric top section;
a second conductive side section over the dielectric side section, over the device second sidewall, and continuous with the second conductive top section; and
a second conductive bottom section over the dielectric bottom section and continuous with the second conductive side section.

13. The semiconductor device of claim 12, further comprising:
an electronic component comprising:
a component bottom side;
a component first terminal on the component bottom side;
a component second terminal on the component bottom side; and
a component sidewall;
a first internal interconnect coupled to the component first terminal;
a second internal interconnect coupled to the component second terminal;
a first external interconnect on a bottom of the substrate; and
a second external interconnect on the bottom of the substrate;
wherein:
the component first terminal is coupled to the device first terminal, through the dielectric first opening, by the first internal interconnect and the first conductive top section; and
the component second terminal is coupled to the second external interconnect by the second internal interconnect, the second conductive top section, the second conductive side section, and the second conductive bottom section.

14. A semiconductor device comprising:
a semiconductor device top side;
a semiconductor device bottom side opposite the semiconductor device top side; and
a semiconductor device sidewall between the semiconductor device top side and the semiconductor device bottom side;
an electronic device comprising:
an electronic device top side;
an electronic device bottom side opposite the electronic device top side; and
an electronic device sidewall between the electronic device top side and the electronic device bottom side;
a dielectric layer conformal with the electronic device top side, the electronic device sidewall, and the semiconductor device bottom side, wherein the dielectric layer comprises:
a dielectric layer first upper surface over the electronic device top side; and
a dielectric layer second upper surface over the semiconductor device bottom side,
wherein a distance between the dielectric layer first upper surface and the semiconductor device bottom side is greater than a distance between the dielectric layer second upper surface and the semiconductor device bottom side;
a first conductor that extends along the dielectric layer first upper surface and the dielectric layer second upper surface; and
a protective material covering the first conductor and the electronic device.

15. The semiconductor device of claim 14, further comprising:
a first dielectric opening in the dielectric layer second upper surface and
an external interconnect coupled to the first conductor through the first dielectric opening in the dielectric layer second upper surface;
an electronic component comprising:
a component bottom side; and
a component first terminal on the component bottom side; and
a first internal interconnect coupled to the component first terminal and to the first conductor;
wherein the component first terminal is coupled to the external interconnect by the first conductor; and
wherein the protective material encapsulates the first internal interconnect and contacts the component bottom side.

16. The semiconductor device of claim 15, wherein:
the electronic device comprises an electronic device first terminal on the electronic device top side; and
the component first terminal is coupled to the electronic device first terminal by the first internal interconnect and the first conductor.

17. The semiconductor device of claim 15, wherein:
the protective material comprises a protective sidewall;
the electronic component comprises a component sidewall; and
the semiconductor device sidewall comprises a sidewall of the dielectric layer, the component sidewall, and the protective sidewall.

18. The semiconductor device of claim 14, wherein the electronic device bottom side is exposed from the dielectric layer at the semiconductor device bottom side.

19. A method comprising:
providing an electronic device comprising:
a device top side comprising a device first terminal;
a device bottom side opposite the device top side; and
a device first sidewall between the device top side and the device bottom side; and
providing a substrate comprising:
a dielectric material comprising:
a dielectric top section over the device top side, wherein the dielectric top section comprises a dielectric first opening over the device first terminal;
a dielectric side section over the device first sidewall and continuous with the dielecteic top section; and
a dielectric bottom section comprising a lower surface substantially coplanar with the device bottom side and continuous with the dielectric side section; and
providing a first conductive material comprising:
a first conductive top section over the dielectric top section and coupled to the device first terminal through the dielectric first opening;
a first conductive side section over the dielectric side section and continuous with the first conductive top section; and
a first conductive bottom section over the dielectric bottom section and continuous with the first conductive side section.

20. The method of claim 19, further comprising:
providing an electronic component comprising:
a component bottom side; and
a component first terminal on the component bottom side;
coupling a first internal interconnect with the component first terminal and the first conductive top section; and
coupling an external interconnect with the first conductive bottom section through the dielectric bottom section;
wherein:
providing the substrate comprises:
providing the dielectric material conformal to a contour of the electronic device;
providing the first conductive material comprises:
providing the first conductive material conformal to a contour of the dielectric material and the electronic device; and
providing a portion of the first conductive top section through the dielectric first opening and coupled to the device first terminal; and
coupling the external interconnect comprises:
coupling the component first terminal with the external interconnect by the first internal interconnect, the first conductive top section, the first conductive side section, and the first conductive bottom section.

21. The method of claim 19, further comprising:
providing an encapsulant over the first conductive material, the dielectric material, and the electronic device;
wherein:
providing the substrate comprises:
providing the dielectric material conformal to a contour of the electronic device;
providing the first conductive material comprises:
providing the first conductive material conformal to a contour of the dielectric material and the electronic device; and
providing a portion of the first conductive material top section through the dielectric first opening and coupled to the device first terminal; and
providing the encapsulant comprises:
providing a bottom of the encapsulant conformal to the first conductive top section, the first conductive side section, and the first conductive bottom section.

* * * * *